(12) United States Patent
Branz et al.

(10) Patent No.: US 8,075,792 B1
(45) Date of Patent: *Dec. 13, 2011

(54) NANOPARTICLE-BASED ETCHING OF SILICON SURFACES

(75) Inventors: Howard Branz, Boulder, CO (US); Anna Duda, Denver, CO (US); David S. Ginley, Evergreen, CO (US); Vernon Yost, Littleton, CO (US); Daniel Meier, Atlanta, GA (US); James S. Ward, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 932 days.

This patent is subject to a terminal disclaimer.

(21) Appl. No.: 12/053,372

(22) Filed: Mar. 21, 2008

(51) Int. Cl.
*C03C 15/00* (2006.01)

(52) U.S. Cl. ............. 216/89; 216/40; 216/67; 427/259; 427/404; 428/209; 430/311; 430/312; 430/313

(58) Field of Classification Search .............. 216/67, 216/40, 41, 47, 49, 89; 427/259, 404; 428/195, 428/209; 430/311, 312, 313
See application file for complete search history.

(56) References Cited

U.S. PATENT DOCUMENTS

| | | | |
|---|---|---|---|
| 6,329,296 B1 * | 12/2001 | Ruby et al. | 438/712 |
| 6,538,801 B2 | 3/2003 | Jacobson et al. | |
| 6,721,083 B2 | 4/2004 | Jacobson et al. | |
| 7,090,783 B1 * | 8/2006 | Cui et al. | 216/40 |
| 2002/0145792 A1 | 10/2002 | Jacobson et al. | |
| 2003/0096113 A1 | 5/2003 | Jacobson et al. | |
| 2005/0056118 A1 | 3/2005 | Xia et al. | |
| 2005/0271805 A1 | 12/2005 | Kambe et al. | |
| 2006/0281333 A1 | 12/2006 | Shin et al. | |
| 2006/0281334 A1 | 12/2006 | Shin et al. | |
| 2007/0155021 A1 | 7/2007 | Zhang et al. | |

(Continued)

OTHER PUBLICATIONS

C.Chartier et al. Electrochimica Acta, vol. 53, (2008), pp. 5509-5516.*

(Continued)

*Primary Examiner* — Lan Vinh
*Assistant Examiner* — Maki Angadi
(74) *Attorney, Agent, or Firm* — Cynthia S. Mitchell; Paul J. White; John C. Stolpa (57) ABSTRACT

A method (300) of texturing silicon surfaces (116) such to reduce reflectivity of a silicon wafer (110) for use in solar cells. The method (300) includes filling (330, 340) a vessel (122) with a volume of an etching solution (124) so as to cover the silicon surface 116) of a wafer or substrate (112). The etching solution (124) is made up of a catalytic nanomaterial (140) and an oxidant-etchant solution (146). The catalytic nanomaterial (140) may include gold or silver nanoparticles or noble metal nanoparticles, each of which may be a colloidal solution. The oxidant-etchant solution (146) includes an etching agent (142), such as hydrofluoric acid, and an oxidizing agent (144), such as hydrogen peroxide. Etching (350) is performed for a period of time including agitating or stirring the etching solution (124). The etch time may be selected such that the etched silicon surface (116) has a reflectivity of less than about 15 percent such as 1 to 10 percent in a 350 to 1000 nanometer wavelength range.

20 Claims, 6 Drawing Sheets

U.S. PATENT DOCUMENTS

2007/0155022 A1 7/2007 Yamakawa et al.
2007/0184576 A1 8/2007 Chang et al.
2007/0190326 A1* 8/2007 Perry et al. .................... 428/403
2007/0247620 A1 10/2007 Koo
2007/0281249 A1 12/2007 Tutt et al.
2009/0236317 A1* 9/2009 Yost et al. ....................... 216/99

OTHER PUBLICATIONS

Koynov, S. et al, Black Nonreflecting Silicon Surfaces for Solar Cells, Applied Physics Letters 88, 203107 (2006).
Koynov, S. et al, Black Multi-Crystalline Silicon Solar Cells, Rapid Research Letters, Phys. Stat. Sol. 1, No. 2, R53-R55 (2007).

* cited by examiner

FIG. 6

NANOPARTICLE-BASED ETCHING OF SILICON SURFACES

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

CROSS-REFERENCE TO RELATED APPLICATIONS

The application is related to co-pending U.S. patent application Ser. No. 12/053,445, US Publication Number US 2009/0236317 A1, entitled "Anti-Reflection Etching of Silicon Surfaces Catalyzed with Ionic Metal Solutions," identified by which is incorporated herein by reference in its entirety.

BACKGROUND

In recent years, there has been a renewed interest in renewable energy including solar energy, and this has resulted in extensive research into methods of fabricating higher efficiency solar cells that convert sun light into electricity by the photovoltaic effect. Despite numerous attempts at making better solar cells with new and exotic materials, the photovoltaics market is still dominated by early or first generation solar cells that are typically silicon wafer-based solar cells. As a result, most solar cell manufacturers are equipped to produce silicon wafer-based solar cells, and research continues to design silicon-based solar cells that can achieve higher conversion efficiencies without an exorbitant increase in production costs, e.g., the aim of research often is to achieve the lowest cost per watt solar cell design that is suitable for commercial production. In addition to use in solar cells, silicon wafers, other silicon layers on substrates, and objects having silicon surfaces are used in numerous other applications such as in electronic devices, telecommunication devices, computers, and even in biological or medical applications, and these applications have also driven research to methods of fabricating silicon wafers and silicon surfaces with particular qualities or characteristics such as a rough, textured, or nanostructured surface.

The performance of solar cells and other optoelectronic devices is directly related to optical losses caused by high reflectivity. Flat silicon surfaces such as those found on an untreated silicon wafer have a high natural reflectivity across the entire range of the solar spectrum that could otherwise be converted to electrical energy by the silicon photovoltaic device. To produce high efficiency solar cells, researchers have sought ways to minimize reflection losses. One common approach has been to provide anti-reflection coatings (ARCs) that typically are selected based on interference. For example, quarter wavelength transparent layers of materials such as $SiO_x$, $TiO_x$, ZnO, ITO, or $Si_3N_4$ are used as ARCs on silicon surfaces. In some cases, ARCs from oxidized silicon may be formed by electrochemical etching. All such ARC coatings are resonant structures and perform well only in a limited spectral range and for specific angles of incidence while the solar spectrum spans a wide range of wavelengths and the incident angle varies during the day. The typical results achieved with simple one-layer ARCs have been a reduction of the surface reflection to about 8 to 15 percent. With more difficult two-layer ARC coatings, the reflectivity can be reduced to about 4 percent, but this kind of coating is expensive to apply and is not effective when placed under glass in photovoltaic modules.

Researchers have shown that efficient suppression of reflection in a broad spectral range can be achieved by deep surface texturing. In this regard, etching can be used on a smooth or polished silicon surface to produce rough surfaces with bumps and pits having typical sizes of several or even ten micrometers, and these rough surfaces exhibit reduced reflectivity due to its reflection and absorption characteristics. In one example, anisotropic etching of silicon in $KOH/C_2H_5OH$ mixtures produces densely packed pyramids that appear black. However, such etching has been typically limited to single crystalline silicon with <1,0,0,> surface orientation, and solar cell design is made more complex by the large penetration pyramids. This texturing also has reflectivity that increases rapidly with the angle of light incidence.

More recently, researchers determined that a fine surface texturing on the nanometer scale may be utilized to control reflectivity of silicon surfaces. Specifically, a textured surface with features smaller than the wavelength of light is an effective medium for controlling reflectivity, and testing with regard to solar cell applications has shown that a fine texture that is only about 300 to 500 nanometers in depth and provides a gradual grading of the silicon density and of the index of refraction from the surface to the bulk that is adequate to suppress reflectivity of a silicon surface in the usable spectral range of photon energies above the band gap. Such a textured surface may be thought of a subwavelength structured surface that behaves itself as an anti-reflective surface, with the gradually tapered density of the anti-reflective surface suppressing reflection over a wide spectral bandwidth and over a large incidence angle of the incoming light. One group of researchers has developed a method of nanoscale texturing of silicon surfaces that utilizes wet chemical etching to reduce optical losses due to surface reflection to below 5 percent at all solar wavelengths for crystalline silicon.

Briefly, the texturing of the silicon surfaces involves black etching in a three step process. First, a discontinuous gold (Au) layer with a thickness of about 1 to 2 nanometers is deposited by thermal evaporation or other deposition techniques. This initial metal coating is made up of Au clusters or islands that in later steps provide a catalytic action or function. Second, a wet chemical etching of the silicon material is performed using an aqueous solution of hydrofluoric acid (HF) and hydrogen peroxide ($H_2O_2$). This solution etches clean or non-coated portions of the silicon surface very slowly but near or about the periphery of the Au islands a texture with a depth of up to 500 nanometers forms very quickly, such as at an etch rate of about 330 nanometers per minute (which indicated that catalytic action to these researchers of the Au clusters or islands). Third, since gold is a detrimental impurity in silicon surfaces, the remaining gold is removed from the textured silicon surface such as by room temperature etching in an aqueous solution of iodine and potassium iodide. The researchers indicated that this multi-step process including deposition of a metallic or catalytic layer may be performed on different silicon surfaces including morphologies such as crystalline, multicrystalline, and amorphous as well as differing doping such as n-type, p-type, and intrinsic doping. The amount of absorbed light was increased with this black etch treatment and results showed reflectivity of as little as 2 to 5 percent in the high light absorption ranges of the silicon samples.

While such etching processes produce highly non-reflective or "black" silicon surface, there are a number of drawbacks that may hinder wide adoption of such processes. The deposition of gold may be cost prohibitive (e.g., undesirably increase the production cost or price of solar cells or other optoelectronic devices). The costs include material costs associated with deposition of the thin layers of pure gold and also include high capital equipment costs associated with purchase, operation, and maintenance of vacuum deposition and other equipment used in the metallic deposition steps of the process. The process also requires two or more steps to provide the etching or texturing, which increases manufacturing complexity and fabrication times.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

This is achieved, in part, by providing a method of texturing or black etching a silicon surface such as the surface of a silicon wafer. The method includes positioning a wafer or silicon layer on a substrate with at least one polished silicon surface in a vessel or container. The method also includes filling the vessel with a volume of an etching solution so as to cover the silicon surface of the wafer or layer. The etching solution is made up of a catalytic nanomaterial and a oxidant-etchant solution. The catalytic nanomaterial may include, for example, 2 to 30 nm Au nanoparticles, 2 to 30 nm Ag nanoparticles, and/or noble metal nanoparticles, which may be provided in as a colloidal solution. The oxidant-etchant solution is formed with an etching agent, such as HF, and an oxidizing agent (e.g., a silicon oxide or simply silicon oxidizing agent), which may be one of $H_2O_2$, $O_3$, $CO_2$, $K_2Cr_2O_7$, $CrO_3$, $KIO_3$, $KBrO_3$, $NaNO_3$, $HNO_3$, and $KMnO_4$. Etching is performed for a length of time by agitating or stirring the etching solution in the vessel. The texturing method may be thought of as a one-step or reduced steps process because there is no requirement that the silicon surface be coated with a metal catalyst prior to etching, and in practice the filling and etching step may be performed substantially concurrently. Further, in some cases, the three ingredients or components of the etching solution (e.g., the source of nanoparticles, the etching agent, and the oxidizing agent) may be pre-mixed or placed in the vessel to be combined by agitating or stirring in the vessel.

The etch time or length of time of the etching is typically relatively short such as less than about 15 minutes and may be selected such that the etched silicon surface has a reflectivity of less than about 15 percent (and even less than 10 percent or lower) in a wavelength range of about 350 to about 1000 nanometers. The etch time may also or alternatively be selected to etch or create a certain roughening or tapered/textured surface such as may be characterized as having a plurality of tunnels or etch pits having depths in the range of about 300 to 500 nanometers and, in some cases, having diameters that, at least toward the silicon surface, are greater than about 5 to 10 times the size of nanoparticles provided by the catalytic nanomaterial. The silicon surface may vary such as to be monocrystalline, multicrystalline, or amorphous, and the surface may include various amounts of doping (e.g., p-type or it-type doping).

By way of another example, but not as a limitation, an embodiment includes a method of reducing reflectance of a silicon surface. The method includes providing a silicon surface such as a side of a wafer or the like and then positioning a plurality of nanoparticles of a catalytic material proximate to the silicon surface. Such positioning may involve spraying the catalytic material on the silicon surface or otherwise coating such surface or, in other cases, it may involve providing the catalytic material with oxidant-etchant solution components in a vessel or bath. The method continues with soaking the silicon surface and the nanoparticles in a bath of oxidant-etchant solution and also agitating the oxidant-etchant solution until the silicon surface is etched so as to have a texture that has reduced reflectance (e.g., less than about 10 percent reflectance). The method may continue with removing or cleaning the nanoparticles from the etched silicon surface with a stripping solution. In some embodiments, the catalytic material is a metal chosen from gold, silver, platinum, palladium, copper, nickel, and cobalt, and the nanoparticles are typically less than about 30 nanometers in size (e.g., about 5 nm or less for gold, less than about 20 nm for silver, less than about 30 nm for palladium, and the like). The texture of the etched silicon surface may include tunnels of a diameter at the silicon surface of a least about 5 to 10 times the size of the nanoparticles and of a depth exceeding about 300 nm. The oxidant-etchant solution may include an oxidizing agent of silicon oxide or dioxide and an etching agent such as hydrofluoric acid.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

The following provides a description of exemplary methods and systems for texturing silicon surfaces such as to create a tapered density surface to significantly reduce reflectivity (e.g., to create an anti-reflective surface on a silicon wafer that may be used in a solar cell). Prior methods for producing non-reflective or "black" surfaces required that metal such as gold (Au) be deposited as islands or clusters on a clean silicon surface. The deposition often involved evaporating a 1 to 2 nanometer layer of gold upon the silicon surface, and the processing would then continue with etching the silicon with the metal covering in an aqueous solution of hydrofluoric acid (HF) and hydrogen peroxide ($H_2O_2$). In contrast, embodiments of the nanoparticle-based etching process described herein eliminate the expensive and capital-intensive gold deposition step by utilizing catalytic nanoparticles that act more effectively as catalysts than gold islands due, in part, to the greater surface area presented and also act to provide a more uniform surface texturing. The process is also quicker and less expensive to implement because the catalytic nanoparticles may be mixed directly with a oxidant-etchant solution (e.g., HF/$H_2O_2$ or the like) in or upstream of the reaction vessel holding a silicon wafer or substrate. This one step etching process requires little capital investment compared with vacuum and other metal deposition techniques and also requires less time to complete as it eliminates a deposition step.

As will become clear, a number of catalytic nanomaterials may be used to practice the etching process with one embodiment using gold nanoparticle colloidal solution that is mixed with an etchant such as HF or the like and also with an oxidizing agent such as $H_2O_2$ or the like. In other embodiments, nanoparticles of other noble metals are provided as the catalytic nanomaterial such as silver, palladium, platinum, or the like, and this may be useful in further reducing the cost of etching and may be desirable as some of these metals may be less deleterious impurities in silicon as is the case with silver. Generally, the silicon surface is a polished surface, but in some cases, the etching techniques may be performed in combination with other anti-reflection techniques. For example, the silicon surface may be an anisotropically pyramid-textured Si <1,0,0,> surface (or other textured Si surface) that is then treated with a one step etching process by placing the Si <1,0,0,> surface (or a substrate/wafer/device with the Si surface/layer) in an etching solution of catalytic nanoparticles, etching agent, and oxidizing agent. Used independently or with other surfacing processes, the etching solution is stirred or agitated for a period of time (e.g., a predetermined etch time) such as with mechanical stirring or with ultrasonic agitation (e.g., mechanical stirring may be used to achieve better anti-reflection properties while ultrasonic agitation may be used to provide better uniformity of surface reflectivity).

The following description stresses the use of catalytic nanoparticles in etching silicon surfaces for use in controlling (i.e., reducing or minimizing) reflectance, but the etching techniques described herein may be used for texturing silicon for nearly any application in which it is desirable to provide a silicon surface with a particular surface roughness or non-smooth topology such as optoelectronic devices, biomedical device, and the like. The description begins with a general overview of the etching process with reference to FIGS. 1-3. Then with reference to FIG. 4, the description provides an example of one device, i.e., a solar cell, that can be formed with a silicon substrate or wafer with an antireflective surface created by taught texturing methods. Next, the description provides a discussion with reference to FIGS. 5-6 of potential "recipes" (e.g., proportions of and particular types of nanomaterials, etching agents, oxidizing agents, silicon surfaces, agitation methods, etching times, and the like), processes, and the like to achieve useful results particularly with an eye toward reducing or nearly eliminating reflectance to increase efficiency of a solar cell (e.g., increase photon absorption in photovoltaic devices of silicon).

Figure 1:
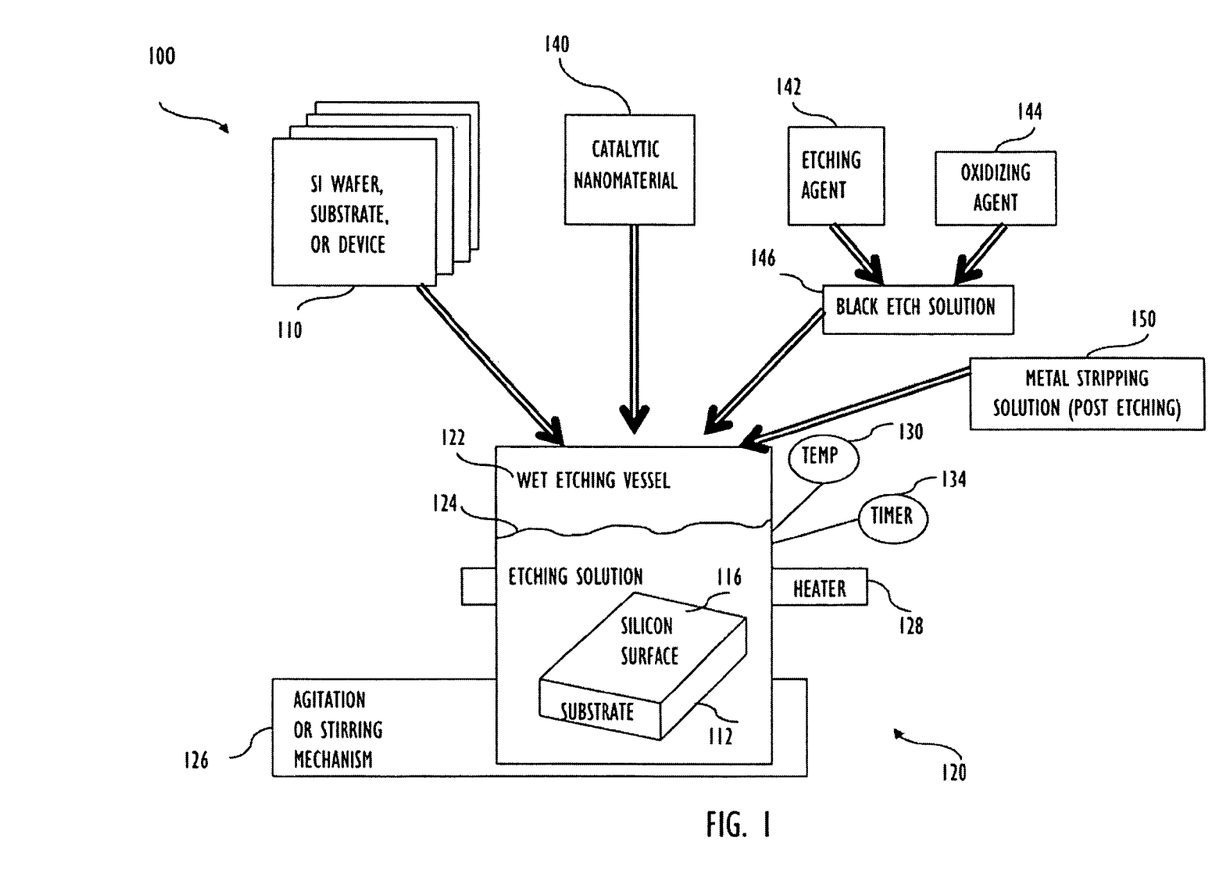
FIG. 1 illustrates in schematic and/or functional block form an etching system for use in texturing silicon surfaces using catalytic nanoparticles and a oxidant-etchant solution.

FIG. 1 illustrates a texturing or etching system 100 of one embodiment. The system 100 includes a source of or quantity of wafers, substrates, or devices 110 with silicon surfaces. These may be Si wafers that are to be used in solar cells, optoelectronics, or other products. The silicon surface on device 110 may be mono-crystalline, multi-crystalline, amorphous, or another orientation, and the type of doping may be varied such as to be n or p-type doping of varying levels (such as from about 0.25 ohm-cm to about 50 ohm-cm or the like). The wafer, substrate, or device 110 may have one silicon surface or two or more such surfaces that will be etched during operation of system 100. The system 100 does not require a metal deposition station, but, instead, the system 100 includes an etching assembly 120 with a wet etching vessel or container 122. During operation, one or more of the Si wafers 110 are placed into the vessel 122 before or after adding a volume of an etching solution 124. In FIG. 1, a single substrate 112 is shown in the vessel with an exposed silicon surface 116.

The assembly 120 includes a mechanism 126 for agitating or stirring the solution 124 initially and/or during etching. The mechanism 126 may be a mechanical stirring device, an ultrasonic agitator, a magnetic-based device, or other device known by those skilled in the art for stirring/agitating reactants or solutions such as etching solution 124. The assembly 120 may include a heater 128 to maintain or raise the temperature of the etching solution 124 within one or more desired temperature ranges to facilitate etching of surface 116. A temperature gauge or thermometer 130 may be provided to monitor the temperature of the solution (and, optionally, provide control feedback signals to heater 128), and a timer 134 may be provided to provide a visual and/or audio indicator to an operator of the assembly 120 regarding an etching or stripping step.

The system 100 further includes a supply or source of a catalytic nanomaterial 140. This source provides a quantity of catalytic nanoparticles such as a quantity of noble metal particles less than 100 nanometers (nm) in a dimension. Good results are typically found with much smaller nanoparticles such as with particles with dimensions less than about 50 nm, or more typically less than about 30 nm. In some of the embodiments described below, the metallic nanoparticles in the range of about 2 to about 20 nm were utilized in the source 140. Exemplary, but not limiting, catalytic nanomaterials include gold, silver, palladium, platinum, copper, and nickel. In some embodiments, the source of the material 140 is a simple solution of a quantity of nanoparticles of the catalytic nanomaterial in deionized water (e.g., gold or silver nanoparticles in deionized water). Generally, this catalytic material (or solution with nanoparticles) is added to the vessel 122 to make up a portion of the etching solution 124, but, in other cases, the material 140 is first added to the oxidant-etchant solution 146 (or to one of its components 142, 144) prior to insertion into the vessel 122 with the Si substrate 112. Specific, nanoparticle sizes, quantities, and materials are discussed in further detail below with reference to FIGS. 5-6.

To achieve etching of the silicon surface 116, the system 100 includes a source of an etching agent 142 and of an oxidizing agent 144. These are chosen specifically for texturing/etching of silicon, and the etching agent 142 may be HF, $NH_4F$, or a similar etchant. The oxidizing agent may be $H_2O_2$ or another agent that has its decomposition catalysed by the nanomaterial. For example, the oxidizing agent 144 may include $H_2O_2$, $O_3$, $CO_2$, $K_2Cr_2O_7$, $CrO_3$, $KIO_3$, $KBrO_3$, $NaNO_3$, $HNO_3$, $KMnO_4$, or the like or a mixture thereof. These agents (or solutions thereof) may be added separately to the vessel 122 to form the etching solution 124 along with the catalytic nanomaterial 140 or, as shown, a oxidant-etchant solution 146 may be formed first by combining the etching agent 142 and the oxidizing agent 144 and then inputting this solution into the vessel 122. The assembly 120 is then operated such as by agitation via mechanism 126 and heating by heater 128 for a time period ("etch time") to texture the surface 116. After the etch time elapses, the solution 124 is removed (or substrate 112 is moved to another container or vessel for metal stripping), and remaining nanoparticles are removed as they are likely undesirable impurities. To this end, the system 100 includes a source of a metal stripping solution 150 that is added to the vessel 122, and the stripping solution may be stirred or agitated (and, optionally, heated with heater 128) by mechanism 126 until all or substantially all of the nanoparticles from material 140 are removed from surface 116. The substrate or wafer 112 may then be used as-is or as a component or layer of a larger device such as a solar cell or photovoltaic device, an optoelectric device, a biomedical device, or the like.

Figure 2:
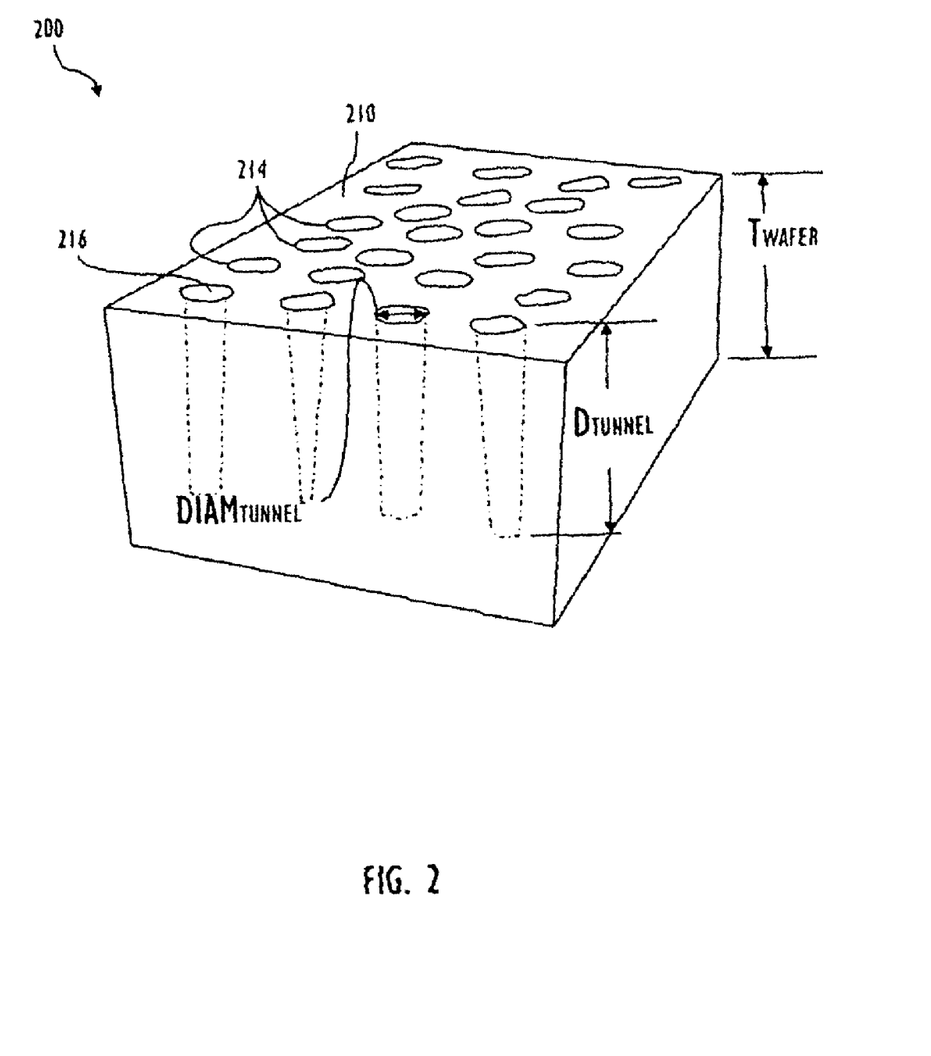
FIG. 2 illustrates a silicon wafer or substrate after nanoparticle-based etching showing a textured silicon surface with a plurality of etched tunnels or pits.

FIG. 2 illustrates a silicon wafer 200 after treatment of an etching process as described herein. As shown, the wafer 200 includes an upper surface or Si surface 210 that has been exposed to an etching solution for a period of time or an etch time. The Si surface 210 has nanoscale roughening that significantly reduces reflectivity. Significantly, the use of nanoparticles in the etching solution (such as 2 to 20 nm gold particles or the like) causes the surface 210 to have a plurality of pits or tunnels 214 where etching has occurred much more rapidly due to the presence of a nanoparticle (not shown in FIG. 2). Each tunnel 214 includes an opening 216 at the surface 210 with a diameter, $Diam_{Tunnel}$, and a depth, $D_{Tunnel}$, that is typically less that the thickness, $T_{wafer}$, of the wafer 200 (e.g., up to about 99.83 percent less than such thickness of about 300μ). For example, the tunnel diameters, $Diam_{Tunnel}$, may be somewhat larger than the particle size such as about 20 to about 50 nm when 5 nm gold nanoparticles are used. The tunnel depths, $D_{Tunnel}$, may be selected to provide a desired physical characteristic (e.g., reduction of light reflection in a desired wavelength range) and in the case of controlling reflectance by the silicon may be between about 300 and about 500 nm with a desired depth being selectable or controlled by controlling time and temperature for a particular etching solution. As can be seen from FIG. 2, the etching processes involving nanoparticles of catalytic material are effective in providing a nanoscale roughness or structure with a gradual density gradient that is desirable for reducing reflectivity.

Figure 3:
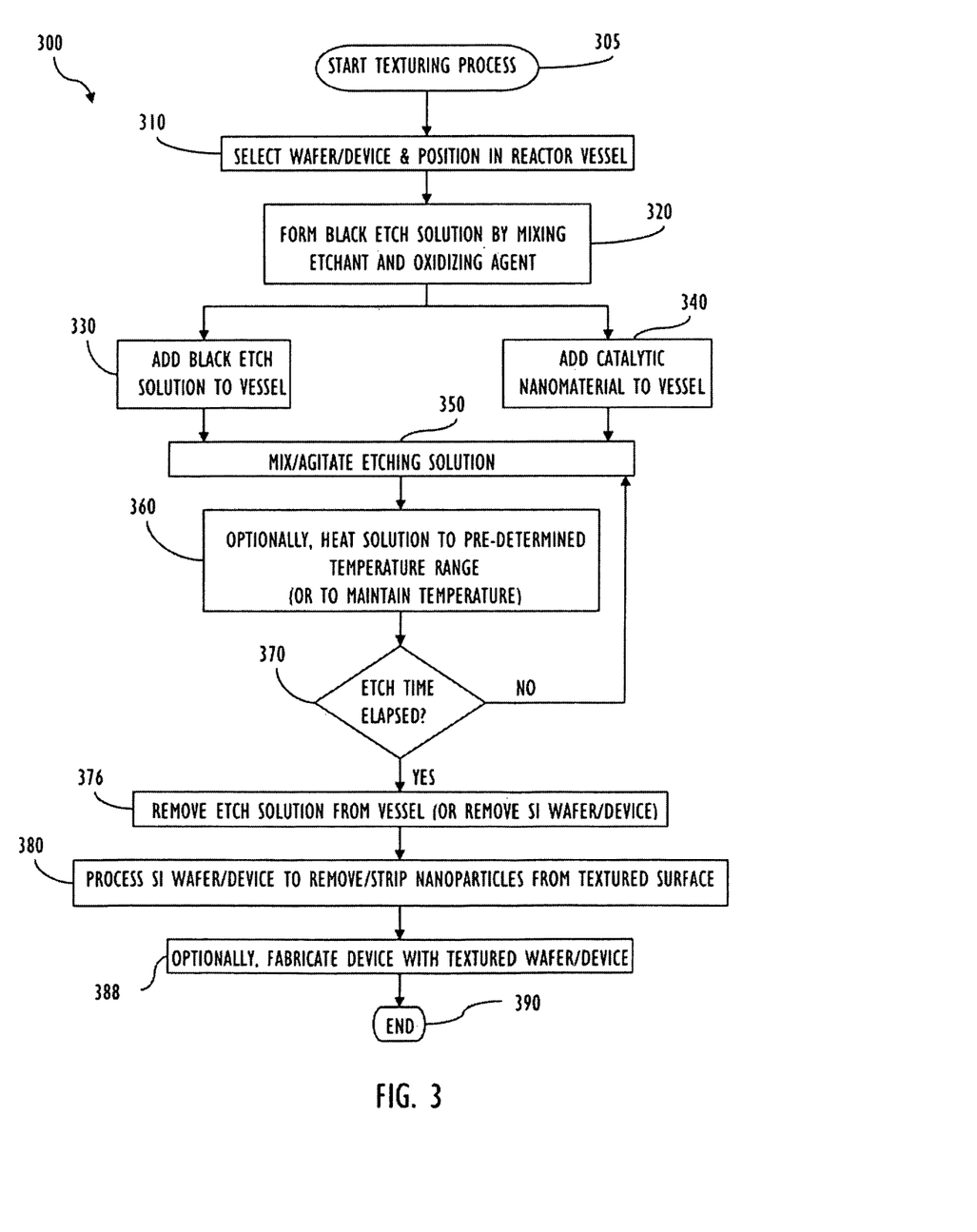
FIG. 3 is a flow chart of an exemplary texturing or etching process using catalytic nanomaterial to texture a silicon surface.

FIG. 3 illustrates one embodiment of a texturing process or method 300 for treating a silicon surface to obtain a desired characteristic such as, but not limited to, a tapered density surface that reduces reflectance or creates a black surface. The process 300 begins at 305 such as with planning or selecting the type of silicon surface to be textured, e.g., a silicon wafer or a silicon film on a substrate with a particular crystalline surface or makeup and a particular type of doping or a device with a silicon surface such as a solar cell with a particular crystalline surface after impurity doping steps are complete. Step 305 may also include choosing a recipe or step-by-step design for the texturing or etching of the silicon surface, and this may include choosing a catalytic nanomaterial, a etching agent for the silicon surface (e.g., HF or the like) and a oxidizing agent (e.g., $H_2O_2$, $O_3$, $CO_2$, $K_2Cr_2O_7$, or the like), the ratio of each of these to provide in the oxidant-etchant solution that includes these two ingredients, the type and amount of agitation/stirring, the desired depth of surface penetration to provide with the tunnel etching, and the time and temperature for etching (which, of course, will vary based on the prior decisions/parameters).

The texturing/etching method 300 continues at 310 with the wafer(s) (or substrates/devices) with the silicon surface being chosen and then positioned into a reaction or etching vessel. At 320, a oxidant-etchant solution is formed by combining or mixing the chosen etching and oxidizing agents (or solutions thereof), but, in some embodiments, this step is not performed and these two agents are simply added to the vessel concurrently or nearly so. The method 300 continues with the performance of steps 330 and 340, which may be formed concurrently or nearly so such as within a preset time period (e.g., less than about 5 minutes or more typically less than about 2 minutes between performance of each step) with either being performed first. At 330, the oxidant-etchant solution is added or input into the vessel with the silicon surface, and at 340, a catalytic nanomaterial source is added to the vessel (such as by providing gold, silver, palladium, platinum, copper, cobalt, nickel, another noble metal, or another catalytic metal/material). In some cases, the particles are provided "dry" or in similar form while in other cases nanoparticles are contained in deionized water (or other appropriate medium) and a volume of such water is added to the vessel at 340. In other embodiments, the nanoparticles are provided by spraying the silicon surface prior to its submersion in the etching solution with the catalytic nanomaterial to provide a desired thickness or layering and/or dispersion of the material and contained nanoparticles on the silicon surface followed by evaporation of the solvent material such as water. Such spraying or coating is then following by submersion of the silicon surface in the oxidant-etchant solution.

At 350, the method 300 includes mixing or agitating the etching solution in the vessel such as with mechanical or ultrasonic mixing technologies. At 360, the method 300 may optionally include heating the solution in the vessel to a predetermined temperature range (or adding heat to maintain the initial temperatures of the oxidant-etchant solution in a desired temperature range) chosen to hasten etching processes. At 370, the method 300 involves determining whether a preset etch time has elapsed (e.g., a time determined previously through testing to provide a desired depth or amount of etching based on the silicon surface type, the catalytic material and its particle size, and the oxidant-etchant solution composition). If not, the method 300 continues at 350.

If the etch time has elapsed, at 376, the method 300 includes removing the etch solution from the vessel or removing the Si wafer(s) from the vessel. At 380, the catalytic nanoparticles and any other undesired atoms left from the previous processing steps are removed from the now textured silicon surface such as with use of a stripping solution selected based on the composition of the catalytic nanomaterial (e.g., a differing solution may be used for gold than for silver or platinum or the like). At 388, the method 300 may include further processing of the textured wafer to fabricate a device that makes use of the textured/etched silicon surface such as a solar cell, a biomedical device, an optoelectrical device, a consumer electronic device, or the like. This process may include steps to passivate the textured surface such as oxidation or deposition of a passivating thin layer such as silicon nitride or amorphous silicon. At 390, the method 300 is ended (or repeated by returning to step 305 where the same method may be repeated or changed such as to use one of the differing "recipes" described herein).

As discussed above, one reason it may be desirable to etch a silicon surface according to the processes described herein is to form a silicon substrate for use in forming a silicon-based solar cell with little or no total reflectance (e.g., without the need for application of an ARC or further processing). It will be understood that nearly any type of solar cell design may make use of the etching processes, and the description is intended to be broad enough to cover a wide variety of solar cells with varying design. However, at this time, it may be useful to at least describe one useful solar cell arrangement and to follow this with a brief discussion of one useful fabrication technique, and these descriptions may then be used to fabricate solar cells and other devices with silicon surfaces textured as described herein.

Figure 4:
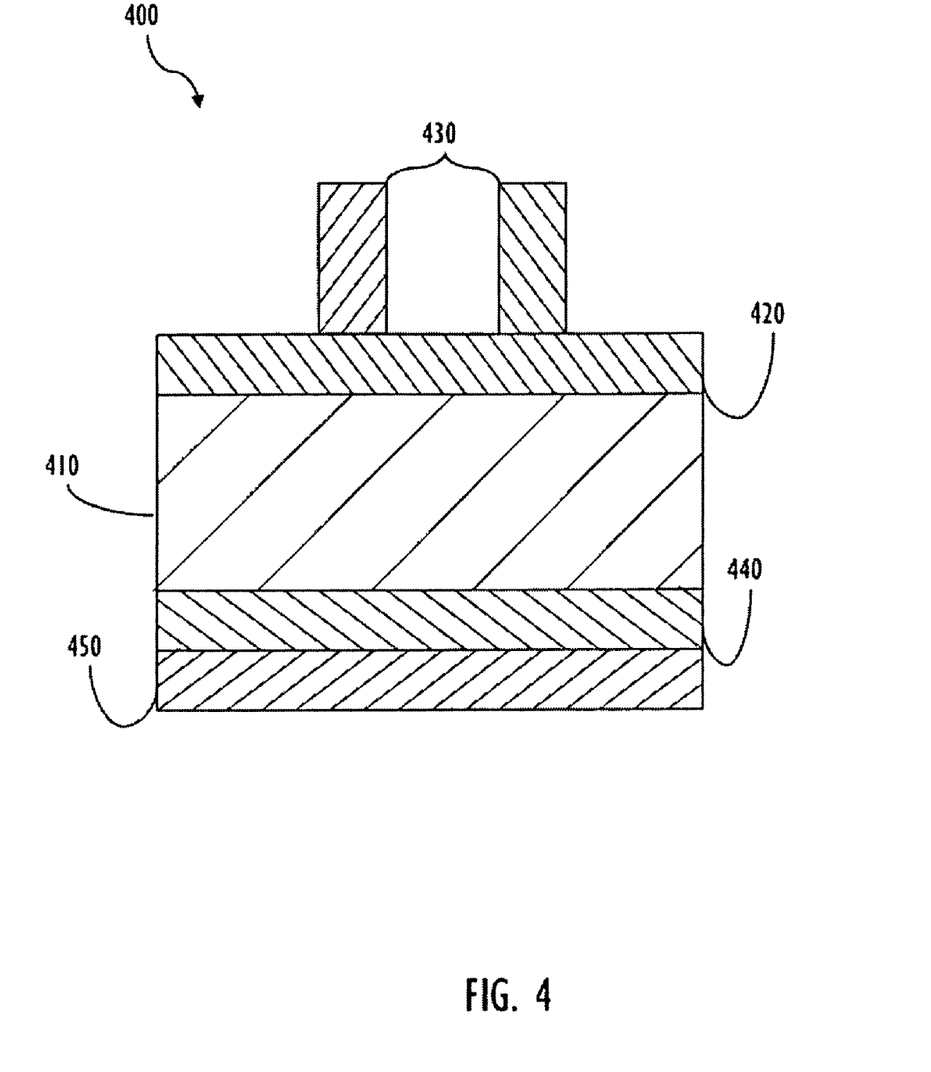
FIG. 4 is a sectional view of a solar cell fabricated with a silicon layer textured with catalytic nanomaterial such as with the system of FIG. 1 and/or the process of FIG. 3.

FIG. 4 illustrates a relatively simple solar cell 400. As shown, the exemplary solar cell 400 includes a silicon substrate 410 with at least an upper surface that has been textured or roughened with a catalytic nanomaterial-based etching process (such as using the system 100 of FIG. 1 or the method 300 of FIG. 3) as described herein. The reflectance of the substrate may be controlled to be under about 15 percent, more typically less than about 10 percent, and in many cases in the range of about 1 to 8 percent or less by such techniques. The substrate 410 may be, for example, a B-doped, p-type silicon wafer or nearly any other silicon material useful in solar cells. In such a case, the cell 400 may further include a n-type emitter layer 420 may be provided on the textured or upper surface of the silicon substrate 410. A plurality of electrical contacts (e.g., silver or other contact material) 430 may be positioned on the emitter layer 420, and the cell 400 may further include additional layers/components to provide a desired functionality such as a back surface field layer 440 (e.g., an aluminum or similar metal layer) and a contact layer 450 (e.g., an aluminum or similar material layer) and a surface passivation layer deposited after the layer 420 is etched. The silicon substrate 410 with an etched surface may take many forms such as an edge-defined film fed grown (EFG) silicon wafer, string ribbon silicon, float zone (FZ) Czochralski (Cz) grown silicon, cast multi-crystalline silicon (mc-Si), a monocrystalline silicon, or another silicon structure or type.

In some cases, formation of a solar cell from a textured/etched silicon wafer may involve the following or other processes known to those skilled in the art. Formation of an emitter on a p-type wafer may involve the diffusion of phosphorus or similar material through the etched surface (e.g., from a spin-on dopant). The doping source may be removed by further etching in concentrated HF or the like, and the result of the diffusion may be the formation of n-type regions. Surface passivation may be provided by oxidizing (e.g., with $O_2$) and annealing (e.g., with $N_2$), which may provide a dry oxide layer with an annealed interface to the silicon to reduce the surface recombination at the heavily doped emitters. A back contact may then be formed by removing the passivating oxide from the back surface of the silicon wafer or substrate and then applying a layer of aluminum or other similar metal and a silver or similar metal onto these back surfaces such as by vacuum evaporation or the like. Next, a front contract grid may be formed such as by opening an array of slits in the passivating oxide on the front or textured surface side of the wafer/substrate and then covering these slits with Ti or the like such as by vacuum evaporation and lift-off of photoresist. The solar cell may be further processed or be assembled with other cells to make solar modules, which in turn may be linked to form photovoltaic arrays. Of course, this is just one simplified method of fabricating a solar cell and it may be modified to form a cell with a black etched surface described herein or other techniques well known in the industry may be used in its place.

The inventors have performed numerous experiments with differing catalytic nanomaterials, oxidant-etchant solutions, and silicon surface types/dopings and have also tested resulting surfaces for reflectivity. The following discussion describes these experiments and the inventors findings as well as more general conclusions and extensions of their ideas. The process described herein is generally a wet-chemical method that is particularly well suited for producing silicon surfaces that exhibit nearly complete suppression of reflectivity in the wavelength range of 350 to 1000 nm. The processes described herein are believed useful with many silicon substrates such as single-crystal p-type Czochralski, {<1,0,0,> and <1,1,1,>}, n and p-type Float Zone, intrinsic, n and p-doped amorphous, and p-doped multi-crystalline as well as other silicon surfaces.

In one set of experiments, the sources of catalytic nanomaterials were gold nanoparticles in deionized water suspensions and silver nanoparticles in deionized water suspensions. In some cases, the silicon wafers were placed or dipped in these solutions/suspensions to apply the nanoparticles to the silicon surface and water was then evaporated from the silicon surfaces, and later etched with a oxidant-etchant solution (e.g., HF and $H_2O_2$) yielded substantially, non-reflective surfaces (e.g., 6 to 12 percent reflectance over a wavelength range of 350 to 1000 nm), but a relatively long etch time or period was required with these application techniques (e.g., from about 15 to 30 minutes or more). Improved results were generally obtained by using a more one-step approach in which the nanomaterial source and oxidant-etchant solution were combined in the vessel in the presence of the silicon surface. For example, a 50:50 volume ratio of nanoparticle colloidal solution and oxidant-etchant solution were provided in a reaction or etching vessel containing a silicon wafer. The solution was then agitated or stirred for several minutes to about less than 15 minutes, and the silicon surface had low reflectivity (e.g., less than about 10 percent in light wavelength ranges of interest for solar cells), improved uniformity of surface texture/roughness, and more readily reproducible results.

Regarding agitation/stirring during the etching process, both magnetic stirring and ultrasonication (e.g., 125 W or the like) were utilized for solution mixing during the etching reactions. Magnetic stirring generally was found to yield wafers with a flatter reflectivity profile over the 350 to 1000 nm wavelength range. However, magnetic stirring may not yield wafers or silicon surfaces with the minimum achievable reflectivity in the middle of this wavelength range and may be ineffective for initiation of certain black etch procedures depending upon the catalytic nanomaterial utilized. Ultrasonication or ultrasonic agitation may be utilized for nearly all kinetic UV-vis reflectance spectrometry assays. Generally, in the experiments/tests run by the inventors, polytetrafluoroethylene (PTFE) or Teflon® labware was used for the investigations, and the chemicals/solutions used were clean room/reagent grade.

The oxidant-etchant solution generally includes an etching agent chosen for silicon and a silicon oxidizing agent whose decomposition can be catalyzed by the chosen catalytic nanomaterial. In one embodiment, HF is used as the etching agent while $H_2O_2$ is the oxidizing agent with the balance of the etching solution volume being deionized water. The specific make up of the oxidant-etchant solution may vary widely to practice the described etching such as 5 to 15% w/w HF, 15 to 25% $H_2O_2$ with the balance being DI $H_2O$, aqua regia, or the like. In one case, a oxidant-etchant solution (sometimes referred herein to as a 2× strength oxidant-etchant solution) was formed with 6.25% w/w HF, 18.75% w/w $H_2O_2$, and balance DI $H_2O$. The final etching solution is somewhat more diluted due to the combination with the solution provided with the catalytic nanomaterial. For example, the etching solution may include equal volumes of the oxidant-etchant solution and the catalytic nanomaterial solution (e.g., a metal colloid solution), and in the above specific example, this would yield an etching solution of 3.125% w/w HF, 9.375% w/w $H_2O_2$ and DI $H_2O$ to provide a volume ratio of 1:5:2 of HF:$H_2O_2$:DI $H_2O$.

Further, the particular catalytic nanomaterial used may vary to practice the etching method but, in some exemplary cases, nanoparticles of a metal such as gold, silver, palladium, platinum, copper, nickel, cobalt, or the like are used with the following details from experiments highlighting results achieved with the use of gold and silver. Also, the size of the nanoparticle may vary with good results generally achieved with small nanoparticles such as those in the 30 nm and smaller range with particularly good results found with gold nanoparticles in the 2 to 10 nm range (e.g., such as about 5 nm or the like as are readily available commercially) and silver nanoparticles in the 15 to 25 nm range (e.g., such as about 20 nm or like as are readily available commercially).

A wide variety of silicon wafers may be etched as described herein with some testing being performed on 1 square inch Czochralski wafers that were polished on one side. The wafers may be n-type or p-type with a wide range of doping (e.g., 0.25 ohm-cm to about 50 ohm-cm or the like). In particular embodiments, the resistivities of p-doped CZ, FZ, and multi-crystalline wafers (excluding tested undoped-pCZ<1,1,1,> wavers) were between about 1 and about 3 ohm-cm. Also, p-doped CZ<3,1,1,> wafers were tested that had a resistivity of about 0.5 ohm-cm. Further, tests were performed using p-doped CZ<1,1,1,> wafers with a resistivity in the range of about 0.2 to about 0.25 ohm-cm. In the following tests, the volume of the etching solution used was typically about 5 ml to about 7.5 ml, but, of course, the volume may be optimized or selected to suit the size/shape of the reactant vessel and size and number of the silicon wafers processed in each batch and based on other variables.

The stripping solution used to remove remaining nanoparticles after etch is complete may practice the process and is typically selected based on a number of factors such as to provide a chemistry suitable for the catalytic nanomaterial. When the nanoparticles were silver or gold, the stripping solution may be 25 g $I_2$/100 g KI per liter of DI $H_2O$ or the like, and the stripping or metal removal time, agitation technique, and volume of stripping solution may be similar or even the same as used in the etching process. Reflectance measurements after etching and stripping may be performed in a number of ways such as with a Cary-5G UV-vis spectrometer that is equipped with a calibrated spherical reflectance or similar device. Real-time UV-vis reflectance spectrometry assays may be performed using devices such as an Ocean Optics' fiber-optic pixel array UV-vis spectrometer.

In another process, a p-CZ<1,0,0,> wafer was placed in 5 nm Au colloid solution (e.g., 1.5 ml) that was then evaporated under vacuum during a period of twenty hours. This application of catalytic nanoparticles was followed by a 1-hour black etch with 1x oxidant-etchant solution of HF and $H_2O_2$ using sonication to provide agitation or the etching solution. In the 350 to 1000 nm wavelength range, reflectance of this textured silicon surface was in the range of about 6 to 8 percent.

Figure 5:
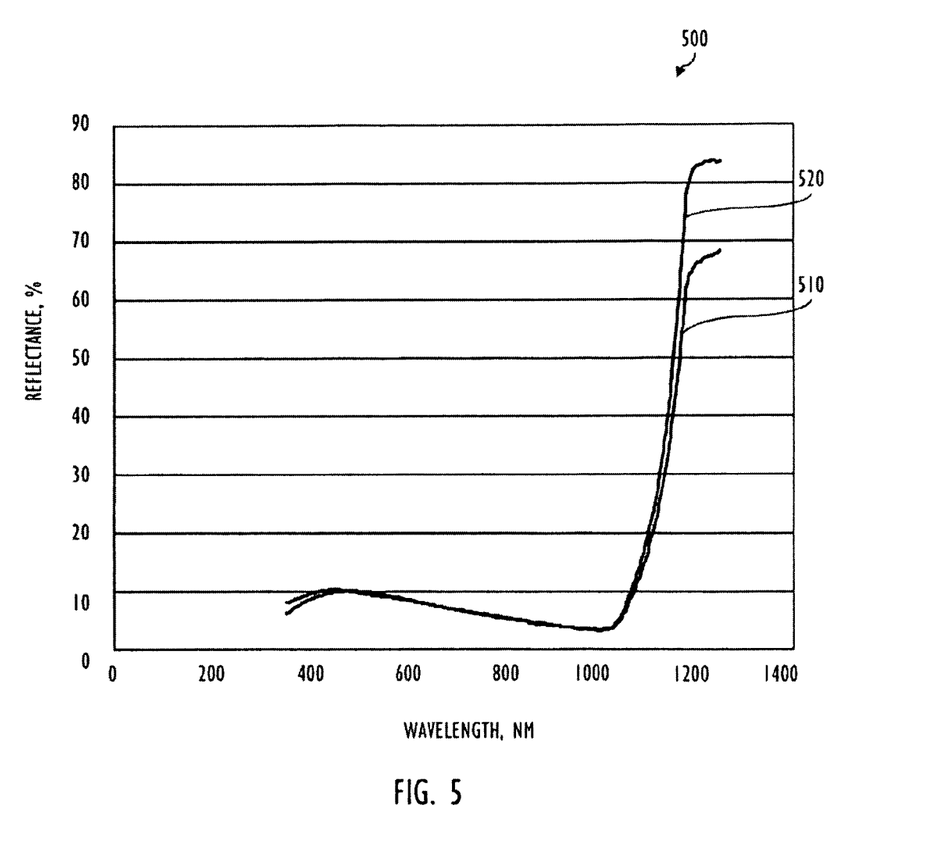
FIGS. 5 and 6 are graphs illustrating reduced reflectance levels achieved in experiments or tests performed on silicon surfaces.

As discussed above, the etching process may be performed in a one-step process in which a metal colloid solution is presented together with the oxidant-etchant solution within a reactant or etching vessel that contains a silicon wafer (e.g., perform etching without first coating or depositing the nanoparticles upon the silicon surface). For example, a p-CZ<1,0,0,> wafer was selected for one-step etching of its silicon surface. The etching solution was a 50:50 pre-mixed solution of 7.5 ml each of 5 nm Au colloid and 2x strength oxidant-etchant solution of HF and $H_2O_2$. The etching solution was agitated with sonication and etching was allowed to proceed for about 15 minutes at room temperature. Remaining gold nanoparticles were removed from the etched surface with a solution of $I_2$/KI. Upon testing in the 350 to 1000 nm range, the roughened or textured silicon surface of the wafer had a reflectance ranging from about 3 percent to about 11 percent. FIG. 5 illustrates these etching results with graph 500. Line 510 illustrates the reflectance over particular wavelengths after etching with the 5 nm Au colloid as a catalyst while line 5es reflectance after removal of the remaining gold nanoparticles.

Figure 6:
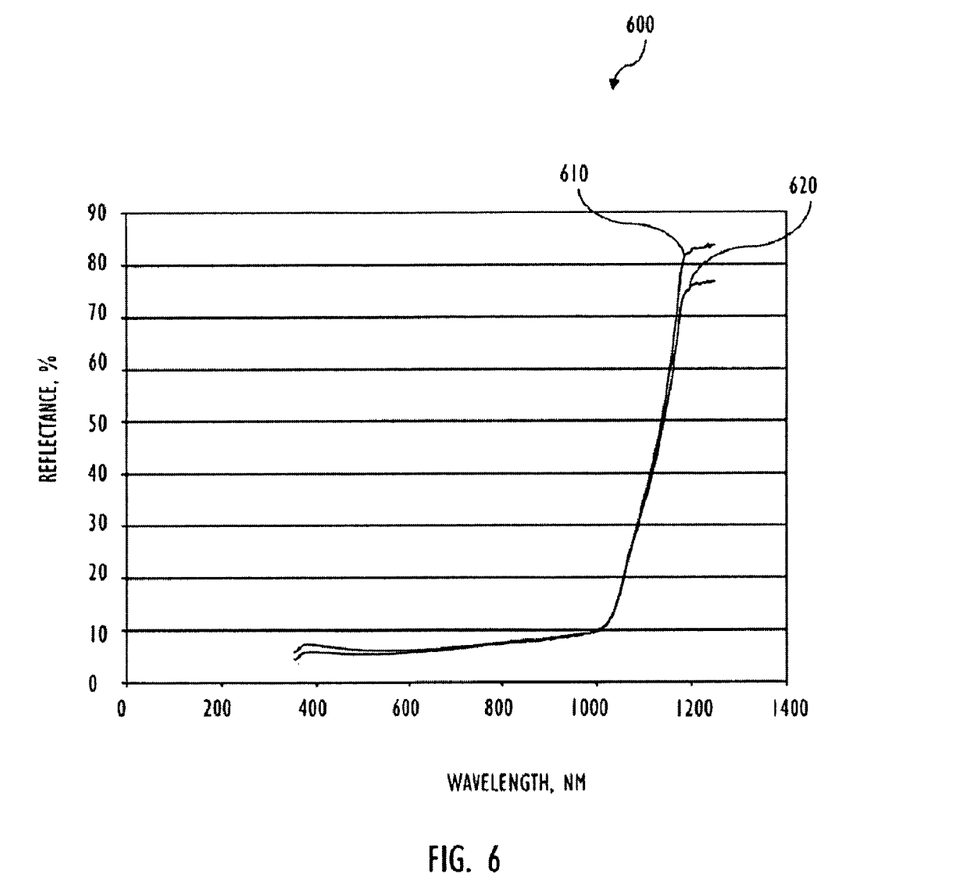

As noted above, the catalytic nanomaterial may include a variety of catalysts other than gold. For example, FIG. 6 illustrates a graph 600 showing results of using a 20 nm Ag colloid as the catalytic nanomaterial or source for one-step etching of a p-CZ<1,0,0,> silicon wafer. Line 610 illustrates the percent reflectance after etching but prior to nanoparticle removal/stripping while line 620 illustrates reflectance after stripping away the silver from the textured surface. As shown for both tests 610, 620, the reflectance was effectively reduced to desirable ranges or levels of blackness as the reflectance is about 4 to about 10 percent (and typically about 6 percent) throughout the 350 to 1000 nm wavelength range for this wafer sample. At about 1100 nm wavelength and above, the silicon is substantially transparent to the light and the reflectivity of a white background causes an apparent increase in reflection from the sample. The etching processing for this experiment or example included a 50:50 pre-mixed solution of about 7.5 ml each of 20 nm Ag colloid and 2x strength oxidant-etchant solution of HF and $H_2O_2$, with stripping with $I_2$/KI solution. Similarly, when a sample of p-mc silicon was etched for 15 minutes in the presence of oxidant-etchant solution and a 5 nm Au colloidal solution, the textured surface was found to have a reflectance in the range of about 5 to about 11 percent over the 350 to 1000 nm wavelength range.

Kinetics testing by use of real-time reflectance measurement was also performed to determine for a range of wavelengths when lower or desired reflectances were achieved by various etching processes (or recipes). For example, kinetics of a black etch reaction of a 10 Angstrom Au coated <1,0,0,>p-CZ wafer showed reflectances in the 0 to 5 percent range were reached in the 25 to 40 second range (which may be used in the future as an etch time). In another example, kinetics of a <1,0,0>p-CZ wafer etched with a combination of 5 nm Au colloid and a 2x strength of oxidant-etchant solution showed a slower result with optimal reflectances of about 2 percent or less were achieved after about 6 minutes while improvements to about 20 percent and down to about 5 percent occurred in the 3 to 5 minute range.

While a number of exemplary aspects and embodiments have been discussed above, those of skill in the art will recognize certain modifications, permutations, additions, and sub-combinations thereof. Et is therefore intended that the following appended claims hereafter introduced are interpreted to include modifications, permutations, additions, and sub-combinations to the exemplary aspects and embodiments discussed above as are within their true spirit and scope. As will be understood from the above description, the catalytic nanomaterial-based etching of silicon is useful for eliminating previously used deposition process for creating metal clusters or islands. Further, the described etching process provides excellent control over silicon characteristics such as reduction of reflectance to facilitate use of textured silicon in solar cells with numerous tunnels being bored or formed fairly uniformly across the silicon surface (e.g., a single nanoparticle may act to catalyze a hole of about the diameter being created in the surface and then etching a very high aspect ratio tunnel or pit in the surface such as a hole diameter of 20 to 50 nm and a tunnel depth in the 300 to 500 nm range). For example, on crystal silicon wafers, gold nanoparticles successfully produced about 5 percent reflection across a broad range of wavelengths. Silver nanoparticles on crystal silicon wafers was also useful as it provided about a reduction of reflection down to about 8 percent. Additionally, gold nanoparticles provided low reflectivity textured surfaces when they were used with an oxidant-etchant solution as described herein on hydrogenated amorphous silicon films. In sonic cases, such as with semi-insulating silicon (e.g., 100 ohm-cm wafers or the like), the etching reaction may be improved or promoted by providing carriers such as with photo activation or with other techniques.

The invention claimed is:

1. A method of texturing a silicon surface, comprising:
positioning a substrate with a silicon surface in a vessel;
filling the vessel with a volume of an etching solution that covers the silicon surface of the substrate, wherein the etching solution comprises a catalytic nanomaterial and a oxidant-etchant solution comprising an etching agent and a silicon oxidizing agent; and
etching the silicon surface by agitating the etching solution in the vessel.

2. The method of claim 1, wherein the catalytic nanomaterial comprises gold nanoparticles selected from range of about 2 to about 30 nanometers.

3. The method of claim 1, wherein the catalytic nanomaterial comprises silver nanoparticles selected from the range of about 2 to 30 nanometers.

4. The method of claim 1, wherein the catalytic nanomaterial comprises a noble metal nanoparticle colloidal solution and the length of time for performing the etching is selected such that the etched silicon surface has a reflectivity of less than about 15 percent in a wavelength range of about 350 to about 1000 nanometers.

5. The method of claim 4, wherein the etching agent comprises HF and the silicon oxidizing agent is an oxidizing agent selected from the group consisting of $H_2O_2$, $O_3$, $CO_2$, $K_2Cr_2O_7$, $CrO_3$, $KIO_3$, $KBrO_3$, $NaNO_3$, $HNO_3$, and $KMnO_4$.

6. The method of claim 1, wherein the etch time period is selected such that the etching creates a plurality of tunnels in the silicon surface having a depth greater than about 300 nanometers and less than about 500 nanometers and having a diameter greater than about 5 times a size of nanoparticles in the catalytic nanomaterial.

7. The method of claim 1, wherein the etching solution is generated in the vessel during the filling by substantially concurrently providing a volume of solution comprising the catalytic nanomaterial and a volume of the oxidant-etchant solution.

8. The method of claim 1, wherein the silicon surface is monocrystalline, multicrystalline, or amorphous.

9. The method of claim 1, wherein the silicon surface comprises p-type doping or n-type doping.

10. A method of reducing reflectivity of a silicon surface, comprising:
providing a silicon surface;
positioning a plurality of nanoparticles of a catalytic material proximate to the silicon surface;
soaking the silicon surface and the nanoparticles in a bath of oxidant-etchant solution;
agitating the oxidant-etchant solution until the silicon surface is etched to have a texture that reduces reflectivity of the etched silicon surface; and
removing the nanoparticles from the etched silicon surface with a stripping solution.

11. The method of claim 10, wherein the catalytic material is a metal selected from the group consisting of gold, silver, palladium, platinum, copper, nickel, and cobalt.

12. The method of claim 10, wherein the nanoparticles are smaller than about 30 nanometer particles.

13. The method of claim 10, wherein the texture of the etched silicon surface comprises tunnels having a diameter at about the etched silicon surface of at least about 5 times a size of the nanoparticles and a depth of at least about 300 nanometers.

14. The method of claim 10, wherein the oxidant-etchant solution comprises an oxidizing agent of silicon oxide and an etching agent comprising hydrofluoric acid.

15. The method of claim 14, wherein the silicon surface comprises a crystalline silicon provided on a wafer, the catalytic material comprises gold, the nanoparticles are smaller that about 10 nanometer particles, and the positioning of the nanoparticles comprises providing a colloidal solution with the nanoparticles in the bath of oxidant-etchant solution.

16. The method of claim 10, wherein the positioning of the plurality of nanoparticles comprises coating or spraying the catalytic material onto the silicon surface prior to the soaking in the bath of oxidant-etchant solution.

17. A method of texturing a silicon wafer, comprising:
placing the silicon wafer in a container;
providing a volume of solution including metal nanoparticles in the container;
providing a volume of oxidant-etchant solution in the container, wherein the oxidant-etchant solution comprises an etching agent and an oxidizing agent;
agitating the nanoparticle solution and the oxidant-etchant solution in the container until a surface of the silicon wafer becomes etched to have a reflectance of less than about 15 percent; and
removing the metal nanoparticles from the etched surface of the silicon wafer.

18. The method of claim 17, wherein the metal nanoparticles comprise gold nanoparticles smaller than about 20 nm, the reflectance of the etched surface is less than about 10 percent, and the etching agent comprises hydrofluoric acid.

19. The method of claim 17, wherein the metal nanoparticles comprise silver nanoparticles smaller than about 30 nm.

20. The method of claim 17, wherein the providing of the nanoparticle solution and the providing of the oxidant-etchant solution are performed at least partially concurrently.

* * * * *